United States Patent [19]
Tohyama

[11] Patent Number: 5,858,811
[45] Date of Patent: Jan. 12, 1999

[54] METHOD FOR FABRICATING CHARGE COUPLED DEVICE (CCD) AS SEMICONDUCTOR DEVICE OF MOS STRUCTURE

[75] Inventor: Shigeru Tohyama, Tokyo, Japan

[73] Assignee: NEC Corporation, Tokyo, Japan

[21] Appl. No.: 779,644

[22] Filed: Jan. 15, 1997

Related U.S. Application Data

[63] Continuation of Ser. No. 562,992, Nov. 27, 1995.

[30] Foreign Application Priority Data

Nov. 28, 1994 [JP] Japan ..................................... 6-292864

[51] Int. Cl.$^6$ ................................................. H01L 21/339
[52] U.S. Cl. ............................................. 438/75; 438/981
[58] Field of Search ................................. 438/60, 75, 76, 438/144, 981

[56] References Cited

U.S. PATENT DOCUMENTS

| | | | |
|---|---|---|---|
| 4,027,381 | 6/1977 | Tasch, Jr. et al. ...................... | 438/144 |
| 4,994,405 | 2/1991 | Jayakar ..................................... | 437/53 |
| 5,114,833 | 5/1992 | Erhardt .................................... | 437/53 |
| 5,238,863 | 8/1993 | Fukusho et al. ......................... | 437/53 |
| 5,492,852 | 2/1996 | Minami .................................... | 437/983 |

FOREIGN PATENT DOCUMENTS 2-189937  7/1990  Japan .
2-292834  12/1990  Japan .

Primary Examiner—Chandra Chaudhari
Attorney, Agent, or Firm—Sughrue, Mion, Zinn, Macpeak & Seas, PLLC

[57] ABSTRACT

The method for fabricating a charge coupled device disclosed includes the steps of forming a gate oxide film and forming a transfer electrode. The provisional oxide film is formed on a semiconductor substrate, and the provisional oxide film at a transfer electrode formation region is selectively etched away. The transfer electrode from a polycrystalline silicon film on the gate oxide film of the transfer electrode formation region is selectively formed, and the provisional oxide film between transfer electrodes is etched away. Since the oxide film which protects the silicon substrate surface (oxide film/silicon interface) of the second layer transfer electrode formation region during the patterning of the first layer polycrystalline film and the insulating oxide film which covers the first layer transfer electrode surface, is formed in the two-step oxidation process, it is possible to adjust the thicknesses of the two oxide films as desired.

2 Claims, 4 Drawing Sheets

METHOD FOR FABRICATING CHARGE COUPLED DEVICE (CCD) AS SEMICONDUCTOR DEVICE OF MOS STRUCTURE

This is a Continuation of application Ser. No. 08/562,992 filed Nov. 27, 1995.

BACKGROUND OF THE INVENTION

1. Field of the Invention

The present invention relates to a method for fabricating a semiconductor device of a MOS structure, and more particularly to a method for fabricating a charge coupled device.

2. Description of the Related Art

A method for fabricating a typical conventional Charge Coupled Device (CCD) is first explained to assist the understanding of the invention. FIGS. 1A–1E are cross-sectional views in the direction of charge transfer of such a conventional charge coupled device. As seen therefrom, after an N type CCD channel 2 and a P+ type channel stopper (not shown) are formed, a first gate oxide film 4 is formed using a thermal oxidation process (FIG. 1A). Next, a first layer polycrystalline silicon film 6 is deposited by a Chemical Vapor Deposition (CVD) process, an impurity is doped, a pattern 7 of photoresist (PR) is formed, and a first layer transfer electrode 8 is formed by etching the silicon film 6 using a plasma etching process (FIGS. 1B and 1C). Then, by etching the entire oxide film, at least the first gate oxide film 4 at regions where second layer transfer electrodes are to be formed is removed, and then a second gate oxide film 11 is formed by carrying out a thermal oxidation process again (FIG. 1D). The second layer transfer electrode 13 is formed from the second layer polycrystalline silicon film using the same procedure as for the first layer transfer electrode (FIG. 1E).

According to the above method, the first gate oxide film 4 is required to be sufficiently thick so that, during the plasma etching of the first layer polycrystalline silicon film 6, any damaging of a silicon substrate surface (oxide film/silicon interface) of at least the regions where the second layer transfer electrodes are to be formed is prevented. Also, the oxidation condition of the second gate oxide film 11 requires that an oxide film, from which the necessary break down voltage characteristics can be obtained between the first and second polycrystalline silicon transfer electrodes 8 and 13, be formed on a surface of the first layer transfer electrode 8.

The problem in the above conventional method is that, if the second gate oxide film 11 is made thicker, in an attempt to enhance the insulating properties between the first and second layer transfer electrodes 8 and 13, the quantity of storable/transferable charges is decreased. If the second gate oxide film 11 is made thinner, in an attempt to increase the quantity of storable/transferable charges, the insulating properties between the first and second layer transfer electrodes 8 and 13 are deteriorated. A method intended to solve the above contradiction is proposed in Japanese Patent Application Kokai Publication Nos. Hei 2-189937 and Hei 2-292834.

The method proposed in the above Japanese Patent Application Kokai Publication No. Hei 2-189937 is explained with reference to FIGS. 2A–2H. A first gate oxide film 4 having a thickness of several hundred Angstroms is grown by a thermal oxidation process on an N type CCD channel 2 which is formed in a P type silicon substrate 1, and further a nitride film 14 having a thickness of several hundred Angstroms is deposited by a CVD process (FIG. 2A). Thereafter, by using a photolithography process, the nitride film 14 at regions where first layer transfer electrodes 8 are to be formed is etched away, and regions where second layer transfer electrodes are to be formed later are left in place (FIG. 2B). Then, a first polycrystalline silicon film 6 is deposited on the resulting structure by a CVD process (FIG. 2C). This first polycrystalline silicon film 6 is selectively etched using a photolithography process thereby forming a first layer transfer electrode 8 (FIG. 2D). An insulating oxide film 12 is deposited to a sufficient thickness on a surface of the first layer transfer electrode 8 by a thermal oxidation process (FIG. 2E). At this time, because of resistance to oxidation of the nitride film 14, there is almost no growth of an insulating oxide film on the nitride film 14. Thereafter, the nitride film 14 is selectively etched away, followed by the oxide film etching (FIG. 2F). In this case, the insulating oxide film 12 is sufficiently thick so that, after the silicon substrate at the regions where the second layer transfer electrodes 13 are to be formed is exposed by the etching away of the first gate oxide film 4, the insulating oxide film 12 on the surface of the first layer transfer electrode 8 has a thickness sufficient to obtain the necessary break down voltage between the first layer and second layer polycrystalline silicon transfer electrodes. Thereafter, a second gate oxide film 11 having a thickness of several hundred Angstroms is grown on the entire surface by a thermal oxidation process (FIG. 2G). Then, a second layer polycrystalline silicon film is grown on the entire surface of the resulting structure, and a second layer transfer electrode 13 is formed by selectively etching the second layer polycrystalline silicon film (FIG. 2H).

In the publication proposing the above method, it is explained that, since the first oxide film, the insulating oxide film and the second gate oxide film are formed independently from one another, the insulating oxide film can be made thick while each of the gate oxide films is made thin.

The method proposed in the Japanese Patent Application Kokai Publication No. Hei 2-292834 is explained with reference to FIGS. 3A–3F. A first gate oxide film 4 having a thickness of several hundred Angstroms is grown by a thermal oxidation process on an N type CCD channel 2 which is formed in a P type silicon substrate 1 (FIG. 3A). Then, after a first layer polycrystalline silicon film 6 is deposited by a CVD process and an impurity is diffused, an insulating oxide film 12 is formed on a first layer polycrystalline silicon film 6 by a thermal oxidation process (FIG. 3B). Thereafter, by selectively etching away the insulating oxide film 12, the first layer polycrystalline silicon film 6 and the first gate oxide film 4, the first layer transfer electrodes 8 are formed, and a silicon substrate surface at regions where second transfer electrodes 13 are to be formed is exposed (FIG. 3C). Then, an oxide film having a thickness of several hundred Angstroms is deposited by a CVD process, and the resulting structure is anisotropically etched until the substrate is exposed and a sidewall oxide film 15 is formed (FIG. 3D). Then, a second gate oxide film 11 having a thickness of several hundred Angstroms is formed by a thermal oxidation process (FIG. 3E). Further, a second layer polycrystalline silicon film is deposited by a CVD process on the entire surface, and this film is patterned to form a second layer transfer electrodes 13 (FIG. 3F).

In the publication proposing the above method, it is explained that, since the insulating oxide film and the sidewall oxide film that cover the first layer transfer electrode, and the second gate oxide film are formed independently from one another, the thickness of each of such films can be appropriately selected.

In the conventional method explained with reference to FIGS. 1A–1E, there are above explained requirements as to the thicknesses of the first gate oxide and second oxide films, and this in turn places limitations as to the charge transfer performance of the charge coupled device.

The above Japanese Patent Application Kokai Publication Nos. Hei 2-189937 and Hei 2-292834 are intended to propose solutions to the problems explained above, but there are also problems in their proposals.

According to the proposal made in the Japanese Patent Application Kokai Publication No. Hei 2-189937, which is shown in FIGS. 2A–2H, a nitride film is formed on a first gate oxide film, and this nitride film is selectively etched away with a region where a second layer transfer electrode is to be formed being covered. Thus, it is arranged such that, when an insulating oxide film is grown on a surface of a first layer transfer electrode (FIG. 2E), there is no formation of a thick oxide film at the region where the second layer transfer electrode is to be formed. The nitride film is normally patterned by plasma etching so that the first gate oxide film 4 is required to have a thickness such that, during the plasma etching of the nitride film 14, at least a silicon substrate surface (oxide film/silicon interface) of the first layer transfer electrode formation region may not suffer from etching damages. This means that the requirement as to the thickness needed during the fabrication is not completely removed. Further, the first gate oxide film 4 has already received the damage during the plasma etching of the nitride film, and the formation of the first layer transfer electrode thereon results in problems leading to the deterioration of the break down voltage properties between the first layer transfer electrode and the silicon substrate, and to increased dark currents in the charge coupled device.

According to the proposal in the Japanese Patent Application Kokai Publication No. Hei 2-292834, as shown in FIGS. 3A–3F, an insulating oxide film 12 is formed prior to the patterning of a first layer polycrystalline silicon film (FIG. 3C), and an oxide film 15 is grown by a CVD process after the patterning of a first layer transfer electrode 8. The oxide film grown 15 is anisotropically etched until a surface of a silicon substrate is exposed, thereby leaving the oxide film 15 only at the sides of the first layer transfer electrode 8 so as to form sidewalls of the oxide film. The anisotropical etching is a kind of plasma etching. Thus, this method directly causes the etching damage to occur on the silicon substrate surface at the second layer transfer electrode formation region. It is difficult to eliminate such etching damage during the subsequent thermal treatment or oxidation, and this may lead to an increase in dark currents, to a deterioration of transfer efficiency, or, in the worst case, to a complete failure of the transfer function in the charge coupled device.

SUMMARY OF THE INVENTION

An object of the present invention, therefore, is to overcome the problems existing in the prior art, and to provide a method for fabricating a charge coupled device which does not suffer from a failure of insulation between the CCD transfer electrodes and the silicon substrate, an increase in the dark currents, and deterioration of transfer efficiency.

According to one aspect of the invention, there is provided a method for fabricating a charge coupled device comprising the steps of:

forming a provisional oxide film on a semiconductor substrate;

forming a first gate oxide film after selectively etching away the first provisional oxide film at a first layer transfer electrode formation region;

forming selectively a first layer transfer electrode from a polycrystalline silicon film on a first gate oxide film of the first layer transfer electrode formation region;

etching away an oxide film formed of the first provisional oxide film and the first gate oxide film between the first layer transfer electrodes;

forming a second provisional oxide film on the semiconductor substrate;

forming a second gate oxide film after selectively etching away the second provisional oxide film at a second layer transfer electrode formation region on the semiconductor substrate; and forming selectively a second layer transfer electrode from a polycrystalline silicon film on a second gate oxide film of the second layer transfer electrode formation region.

In the method according to the present invention, the oxide film to protect the silicon substrate surface (oxide film/silicon interface) at regions where the second layer transfer electrodes are to be formed during the patterning of the first layer polycrystalline silicon film is formed through two separate oxidation steps, one for the formation of a first provisional oxide film and the other for the formation of the first gate oxide film. Thus, even when the first gate oxide film is made thin, the oxide film can be made sufficiently thick to protect the silicon substrate surface by increasing the thickness of the first provisional oxide film. Also, the insulating oxide film that covers a surface of the first layer transfer electrode is formed through two separate oxidation steps, one for the formation of a second provisional oxide film and the other for the formation of the second gate oxide film. Thus, even when the second gate oxide film is made thin, it is possible to secure the necessary thickness of the oxide film so as to provide sufficient insulating properties between the first layer and second layer polycrystalline silicon transfer electrodes by increasing the thickness of the second provisional oxide film. Therefore, the two oxide films are completely free from any restrictions in the fabrication processes used so that the respective thicknesses thereof may be freely set. Also, according to the method of the present invention, the gate oxide film which has received the plasma damage does not remain in place, and further the method does not include any such process step that may give a direct damage to the silicon substrate surface, it can be ensured that there is no possibility of the occurrence of the break down voltage failure between the transfer electrode and the silicon substrate, the increase in the dark currents, and the deterioration of the transfer efficiency.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

FIGS. 4A–4I show, in cross-sectional views in the direction of the charge transfer, a CCD structure for use in explaining a method for fabrication of a first embodiment according to the invention.

Figure 1A:
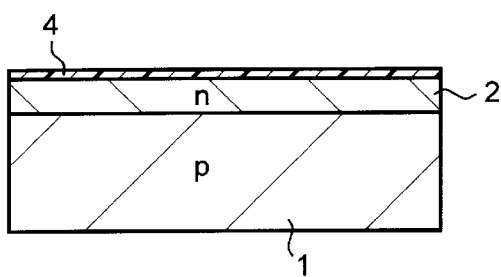
FIGS. 1A–1E are cross-sectional views in the direction of charge transfer of a typical conventional charge coupled device for use in explaining sequential steps of the fabrication process therefor.
Figure 1D:
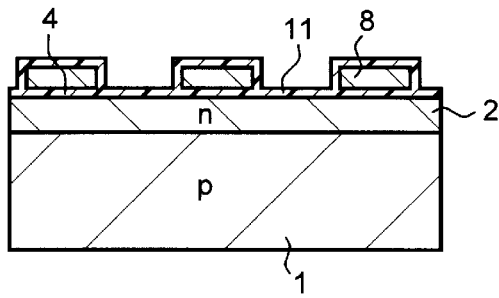
Figure 1B:
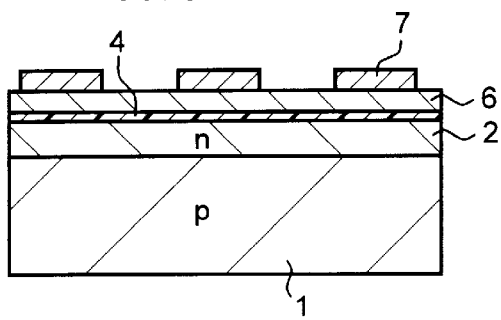
Figure 1E:
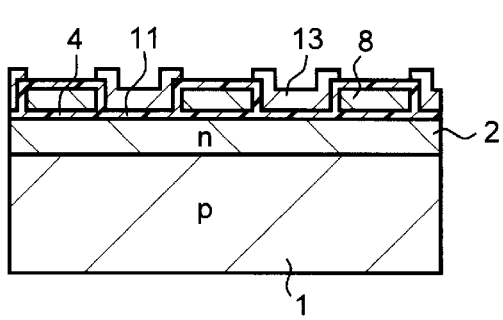
Figure 1C:
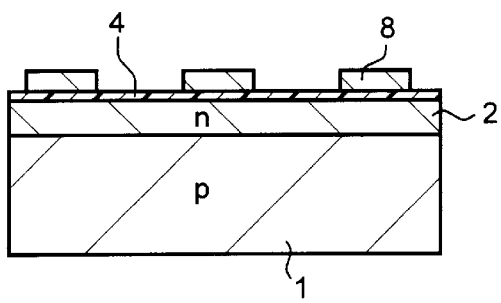
Figure 2A:
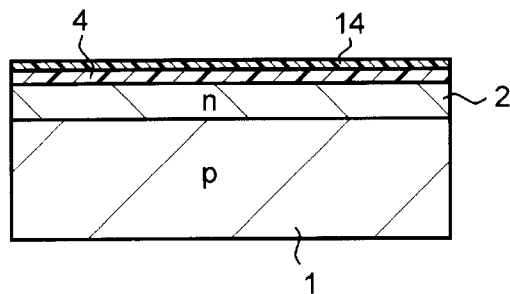
FIGS. 2A–2H are cross-sectional views in the direction of charge transfer of a prior art charge coupled device for use in explaining sequential steps of the fabrication process therefor.
Figure 2B:
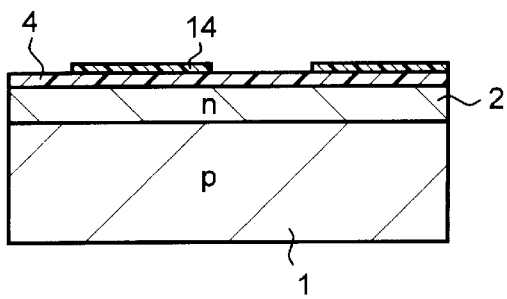
Figure 2C:
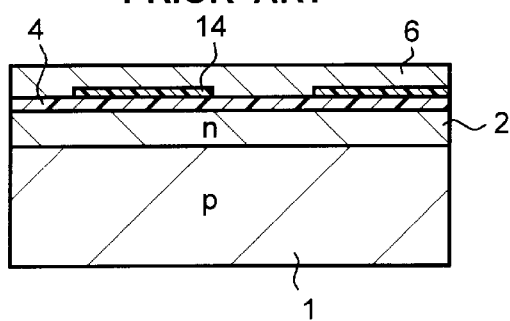
Figure 2D:
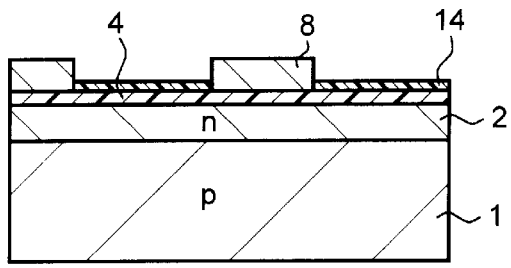
Figure 2E:
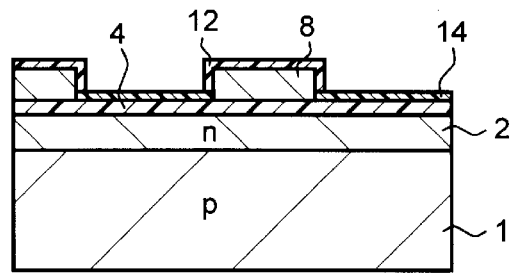
Figure 2F:
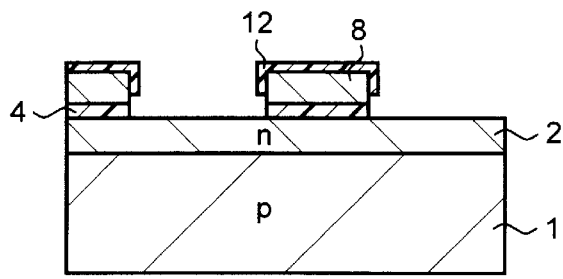
Figure 2G:
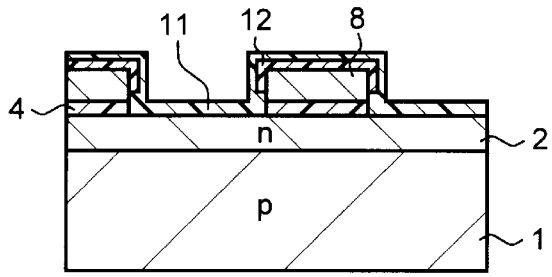
Figure 2H:
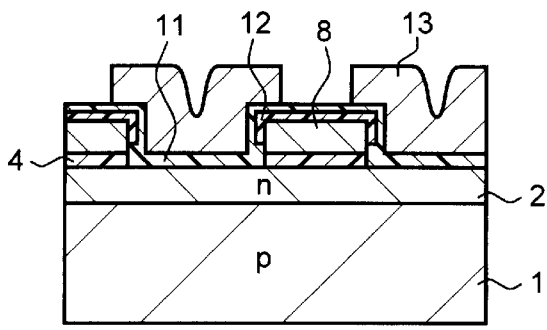
Figure 3A:
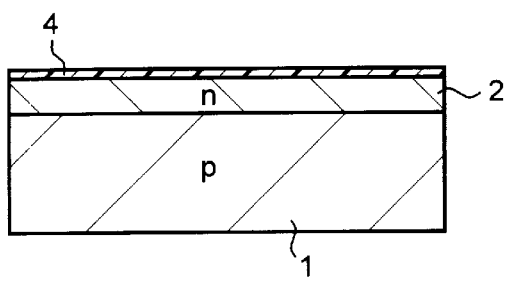
FIGS. 3A–3F are cross-sectional views in the direction of charge transfer of another prior art charge coupled device for use in explaining sequential steps of the fabrication process therefor.
Figure 3D:
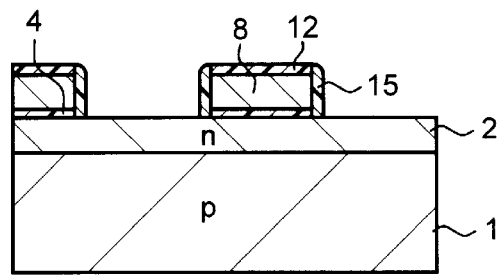
Figure 3B:
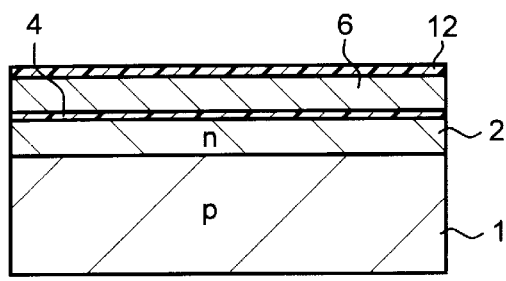
Figure 3E:
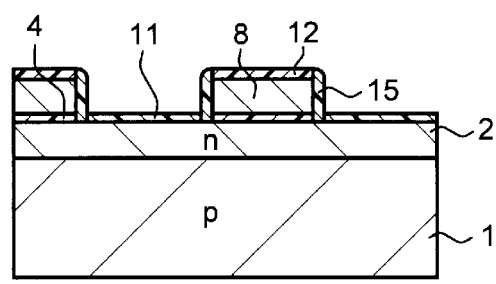
Figure 3C:
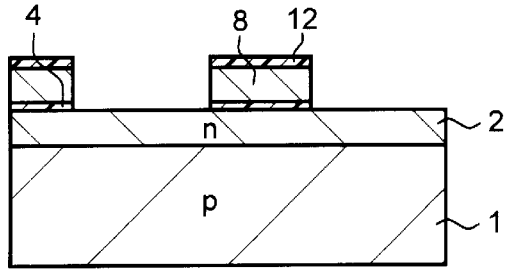
Figure 3F:
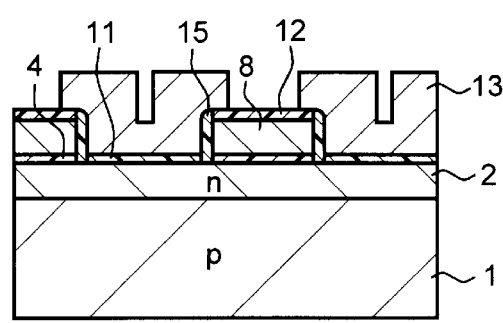
Figure 4A:
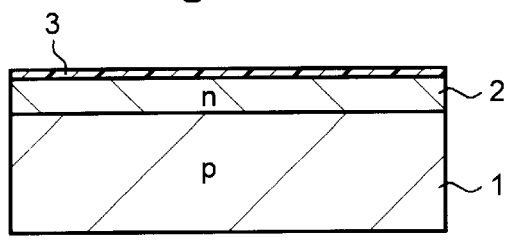
FIGS. 4A–4I are cross-sectional views in the direction of charge transfer of a charge coupled device according to the present invention for use in explaining sequential steps of the fabrication process therefor.
Figure 4B:
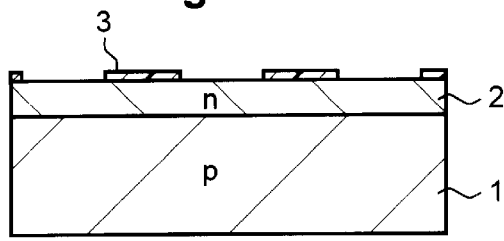
Figure 4C:
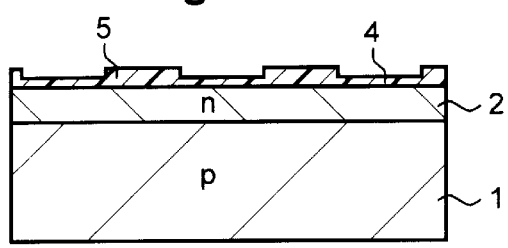

First, an N type CCD channel 2 and a $P^+$ type channel stopper (not shown) are formed in a P type silicon substrate 1, and then a first provisional oxide film 3 is formed by a thermal oxidation process (FIG. 4A). By using a mask of photoresist (PR), the first provisional oxide film 3 at the first layer transfer electrode formation region is selectively etched away using hydrofluoric acid (FIG. 4B). Then, by applying thermal oxidation again, the first gate oxide film 4 is formed on the first layer transfer electrode formation region at which the first provisional oxide film 3 has been removed (FIG. 4C). The thickness of this first gate oxide film 4 is on the order of, for example, 50–500 Angstroms. During the thermal oxidation process in which the first gate oxide film 4 is formed, a further oxide film is formed over a region where the first provisional oxide film 3 remains, and this increases the thickness of the oxide film 5 which consists of the first provisional oxide and first gate oxide films.

Assuming that, in order to prevent the damage to occur on a silicon substrate surface (oxide film/silicon interface) during the plasma etching of the first layer polycrystalline silicon 6, the thickness of the oxide film is required to be, for example, on the order of 700 Angstroms (though this may vary depending on the etching conditions), the thickness of the first provisional oxide film 3 may be about 700-400 Angstroms in correspondence to the thickness of the first gate oxide film 4.

Figure 4D:
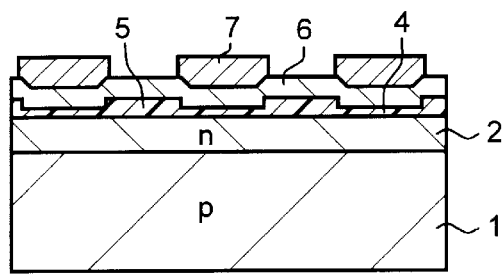
Figure 4E:
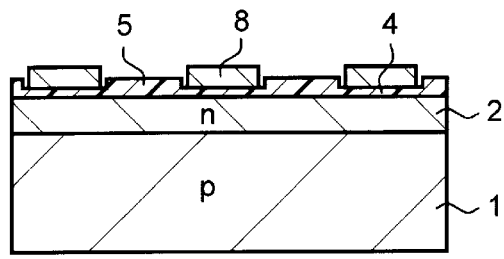
Figure 4F:
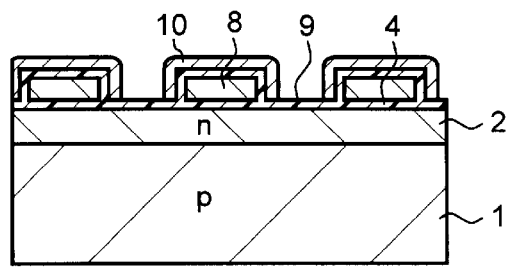
Figure 4G:
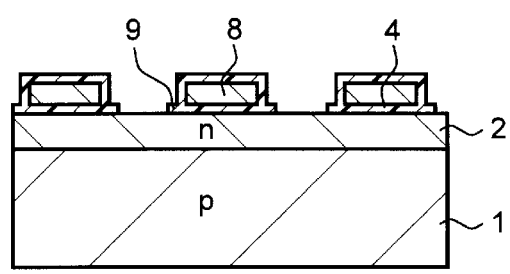

After the first layer polycrystalline silicon film 6 is grown on the entire surface by a CVD process and a high concentration impurity of such as phosphorus or boron is added by a diffusion process, a photoresist (PR) mask 7 having a pattern for the first layer transfer electrode 8 is formed and, by a patterning process using the plasma etching, the first layer transfer electrode 8 is formed (FIGS. 4D and 4E). At this time, the pattern of the PR 7 is designed with a margin such that an edge of the pattern hangs on a part of the thick region of the oxide film and that, when side-etching is made, the edge of the polycrystalline silicon film sets back to the boundary between the thick region and the thin region of the oxide film. In FIG. 4E, the edge is illustrated exaggeratedly as being positioned at the thin region of the oxide film. Following the step of FIG. 4E, the oxide film is etched using hydrofluoric acid such that at least the oxide film 5 consisting of the first provisional oxide film and the first gate oxide film on the CCD channel 2 on the second layer transfer electrode formation region is removed. After the second provisional oxide film 9 is formed by a thermal oxidation process, the region of the first layer transfer electrode 8 and a region other than the region to be lying under the second layer transfer electrode are covered by the PR mask 10, and the second provisional oxide film 9 at a region on the CCD channel which is to lie under the second layer transfer electrode is etched away by using hydrofluoric acid to the verge of the first layer transfer electrode 8 (FIGS. 4F and 4G). In FIG. 4G, the second provisional oxide film 9 is illustrated exaggeratedly as if a significant amount thereof is remaining on the CCD channel to lie under the second layer transfer electrode, but in actuality it is possible to make the remaining film almost none.

Figure 4H:
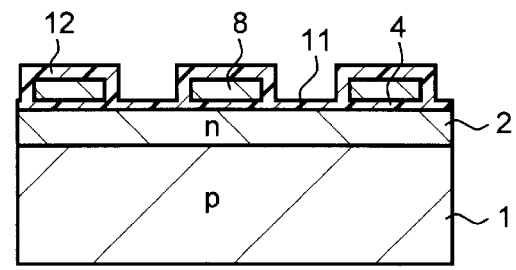
Figure 4I:
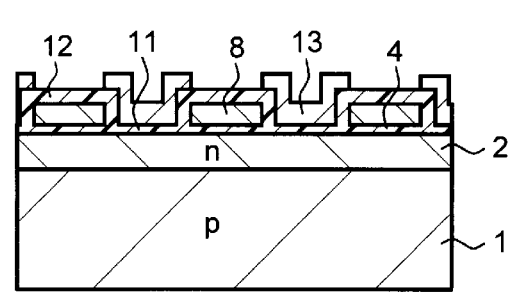

By a thermal oxidation process again, a second gate oxide film 11 is formed on the second layer transfer electrode formation region at which the second provisional oxide film 9 has been removed (FIG. 4H). Also, the thickness of this second gate oxide film 11 is, for example, about 50–500 Angstroms. If the insulating oxide film 12 that covers a surface of the first layer transfer electrode 8 has a thickness of about 2000–3000 Angstroms, it is possible to provide sufficient insulating properties between this insulating oxide film and the second layer transfer electrode 13. In the case of the polycrystalline silicon in which an impurity such as phosphorus or boron is added at high concentration, the rate of oxidation is 2–3 times that for a normal bulk silicon. Assuming that this rate is 2.5 times, it follows that, for the thickness of the insulating oxide film 12 to be 2000–3000 Angstroms, it is sufficient to set the oxidation condition such that the oxide film having a thickness of 800–1200 Angstroms be formed on the silicon substrate in two time oxidation steps, the first step being for the formation of the second provisional oxide film 9 and the second step being for the formation of the second gate oxide film 11. Where the thickness of the second gate oxide film 11 is on the order of 50–500 Angstroms, the thickness required for the second provisional oxide film 9 will be from about 800–500 to about 1200–1000 Angstroms. After the second layer polycrystalline silicon film is grown on the overall surface by a CVD process, and an impurity of phosphorus or boron is added at high concentration by a diffusion process, a photoresist (PR) mask having a pattern of the second layer transfer electrode 13 is formed, and this film is patterned by plasma etching whereby the formation of the second layer transfer electrode 13 is completed (FIG. 4I).

In the above explained fabrication method, each of the oxide film which protects the silicon substrate surface (oxide film/silicon interface) of the second layer transfer electrode formation region during the patterning of the first layer polycrystalline silicon film, and the insulating oxide film which covers the surface of the first layer transfer electrode is formed in the two-step oxidation process which makes it possible to adjust the thicknesses as desired. Thus, the oxidation process of each of the first gate oxide film and the second gate oxide film can be carried out under independent oxidation conditions without being subjected to other restrictions. This means that the thickness of each of these gate oxide films can be freely set. Also, since the gate oxide film which the plasma etching has damaged does not remain, and also since the method does not include a step which causes the direct damage to the silicon substrate surface, it is possible to prevent the break down voltage failure between the transfer electrode and the silicon substrate, the increase in the dark current, and the deterioration of transfer efficiency.

In the above embodiment, the N type CCD channel is formed in the P type silicon substrate, but the invention is still effective when this conductivity is reversed.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A method for fabricating a charge coupled device comprising the steps of:

forming a first provisional oxide film on a semiconductor substrate;

forming a first gate oxide film after selectively etching away said first provisional oxide film at a first layer transfer electrode formation region;

forming selectively a first layer transfer electrode from a polycrystalline silicon film on said first gate oxide film of said first layer transfer electrode formation region;

etching away an oxide film formed of said first provisional oxide film and said first gate oxide film between said first layer transfer electrodes;

forming a second provisional oxide film on said semiconductor substrate;

forming a second gate oxide film after selectively etching away said second provisional oxide film at a second layer transfer electrode formation region on said semiconductor substrate; and forming selectively a second layer transfer electrode from a polycrystalline silicon film on said second gate oxide film of said second layer transfer electrode formation region.

2. The method for fabricating a charge coupled device according to claim 1, in which a silicon substrate is used as said semiconductor substrate.

* * * * *

UNITED STATES PATENT AND TRADEMARK OFFICE
CERTIFICATE OF CORRECTION

PATENT NO. : 5,858,811
DATED : January 12, 1999
INVENTOR(S) : Shigeru Tohyama

It is certified that error appears in the above-identified patent and that said Letters Patent is hereby corrected as shown below:

On the title page, item [57]

In the Abstract, Line 13 after "polycrystalline" insert --silicon--

Signed and Sealed this

Thirteenth Day of July, 1999

Attest:

Attesting Officer

Q. TODD DICKINSON

Acting Commissioner of Patents and Trademarks